US006341978B1

(12) United States Patent
Akeda

(10) Patent No.: US 6,341,978 B1
(45) Date of Patent: Jan. 29, 2002

(54) PRESS-CONNECTING TERMINAL

(75) Inventor: Nobuyuki Akeda, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/708,443

(22) Filed: Nov. 9, 2000

(30) Foreign Application Priority Data

Nov. 12, 1999 (JP) .......................................... 11-322956

(51) Int. Cl.[7] .................................................. H01L 4/26
(52) U.S. Cl. ...................................................... 439/397
(58) Field of Search ................................ 439/397, 407, 439/398, 399, 401, 402, 403, 404, 405, 406

(56) References Cited

U.S. PATENT DOCUMENTS

RE31,132 E * 1/1983 Hoppe, Jr. .................. 439/397
4,806,120 A * 2/1989 Baker ......................... 439/399
5,588,868 A 12/1996 Tsuji et al. ................. 439/397
6,007,365 A 12/1999 Atsumi et al.

FOREIGN PATENT DOCUMENTS

JP 7-272772 10/1995
JP 10-154535 6/1998

* cited by examiner

*Primary Examiner*—P. Austin Bradley
*Assistant Examiner*—Briggitte R. Hammond
(74) *Attorney, Agent, or Firm*—Morgan, Lewis & Bockius LLP

(57) ABSTRACT

A press-connecting terminal (1) includes a press-connecting portion (4) having press-connecting blades (9). The press-connecting blade (9) has a pair of opposed inner surfaces (9*c*) extending downwardly respectively from a pair of bladed, tapering guide surfaces (9*a*) which are slanting downwardly toward the axis of the electric wire (7), and a gap (G), formed between the pair of inner surfaces (9*c*), is smaller than the diameter (d) of a conductor (7*b*) of the electric wire (7). On the basis of at least one of the width (W) of each of the downwardly-extending inner surfaces (9*c*), the size of the gap (G), and the number (n) of the press-connecting blades (9), the total area ($S_T$) of contact of the downwardly-extending inner surfaces (9*c*) with the conductor (7*b*) is set to a value greater than or equal to the cross-sectional area ($\pi d^2/4$) of the conductor (7*b*). Therefore, an electrical resistance, developing between the conductor (7*b*) and each inner surface (9*c*), can be reduced. Accordingly, the deterioration, improper contact and so on of those members around the press-connecting portion due to heat, produced by the electrical resistance between the conductor (7*b*) and each press-connecting blade (9), can be positively prevented.

5 Claims, 6 Drawing Sheets

PRESS-CONNECTING TERMINAL

BACKGROUND OF THE INVENTION

1. Field of the Invention

The present invention relates to a press-connecting terminal used in the wiring installed in a vehicle such as an automobile. More particularly, the present invention relates to press-connecting blades of the press-connecting terminal which can be electrically connected to an electric wire, connected to the press-connecting terminal, with a small electrical resistance.

The present application is based on Japanese Patent Application No. Hei. 11-322956, which is incorporated herein by reference.

2. Description of the Related Art

In automobiles having various electronic equipments mounted thereon, press-connecting terminals have been extensively used for connecting the electronic equipments together and for connecting wire harnesses together.

As shown in FIG. 6, a conventional press-connecting terminal 30 includes a connection portion 31 for connection to a mating male terminal (not shown), a press-connection portion 32 for being press-connected to an end portion of an electric wire 21, and retaining piece portions 33 for press-holding the electric wire 2. A resilient contact piece portion 35 for contact with the mating male terminal, inserted into the connection portion 31 through an insertion port 31*a* in a front end thereof, is provided within the connection portion 31. A lance 36 for retaining the press-connecting terminal, inserted in a connector housing (not shown), against withdrawal, is formed on an upper surface of the connection portion 31, and also a stabilizer 37 for limiting the inserting direction is formed on the upper surface of the connection portion 31.

The press-connecting portion 32 includes two press-connecting blades 41 and 42.

As shown in FIG. 9, the front press-connecting blade 41 is defined or formed by a pair of opposed projecting pieces 44 which are stamped respectively from opposed (right and left) side plates 39 of the press-connecting portion 32, and then are bent inwardly. A press-connecting groove 45 is formed between the opposed projecting pieces 44. The width of this press-connecting groove 45 is smaller than the diameter of a conductor 23 of the electric wire 21.

As shown in FIG. 7, the rear press-connecting blade 42 is formed by stamping a relevant portion of a bottom wall 47 and then by bending it upwardly. This rear press-connecting blade 42 is spaced a predetermined distance from the front press-connecting blade 41. As shown in FIG. 10, a press-connecting groove 49 is also formed in the press-connecting blade 42, and the width of this press-connecting groove is equal to the width of the press-connecting groove 45.

Next, the process of press-connecting the electric wire 21 will be described.

An end portion of the electric wire 21 is press-fitted into the press-connecting blades 41 and 42 from the upper side of the press-connecting portion 32 as indicated by arrow A in FIG. 6. As a result, opposed side edges of each of the press-connecting grooves 45 and 49 cut a sheath 22 of the electric wire 21 to contact the conductor 23, as shown in FIGS. 9 and 10.

Then, the electric wire 21 is fastened by the pair of retaining piece portions (barrel portion) 33 through the sheath 22 as shown in FIG. 8, thus completing the fixing of the electric wire 21 to the press-connecting terminal 30.

In the above conventional press-connecting terminal 30, however, the press-connecting portion 32 is mainly designed to merely firmly press-connect and hold the conductor 23, and the area of contact of each press-connecting blade 41, 42 with the conductor 23 has often been inadequate.

Because of this inadequate contact area, an electrical resistance, developing between the conductor 23 and each press-connecting blade 41, 42, increases to generate heat, so that those members around the press-connecting portion are subjected to deterioration, improper contact and so on, and this has resulted in a problem that the safety of the vehicle is affected.

SUMMARY OF THE INVENTION

The present invention seeks to overcome the above problems of the conventional construction, and an object of the present invention is to provide a press-connecting terminal provided with press-connecting blades which can be electrically connected to an electric wire with a small electrical resistance.

To achieve the above object, according to the present invention, there is provided a press-connecting terminal which includes:

- a base;
- a connection portion, to which a connection terminal of a mating connector is electrically connectable, disposed on the base; and
- a press-connecting portion, to which a conductor of an electric wire is electrically connectable, disposed on the base, the press-connecting portion including plural pairs of press-connecting blades, each pair of which have:
  - a pair of bladed, tapering guide surfaces which slant inwardly downwardly, and
  - a pair of opposed inner surfaces, between which a gap smaller than a diameter of the conductor of the electric wire is formed, and which downwardly extend respectively from the pair of tapering guide surfaces;
- wherein when an electric wire is press-fitted into the gap, the conductor of the electric wire is electrically connected to and held by the plural pairs of press-connecting blades, and
- wherein an effective total contact area of the opposed inner surfaces of the press-connecting blades with the conductor is set to a value equal to or greater than a cross-sectional area of the conductor.

In the press-connecting terminal of the above construction, the functions of the press-connecting blades to press-contact and hold the conductor, as well as the electrical connection of the press-connecting blades to the conductor, can be suitably achieved. Accordingly, those members around the press-connecting portion are prevented from being subjected to deterioration, improper contact and so on by heat produced by the electrical resistance developing between the conductor and each press-connecting blade, and therefore the safety of the vehicle is positively prevented from being affected.

In the press-connecting terminal of the above construction, the effective total contact area is such a total of areas that the conductor of the electric wire contacts with the opposed inner surfaces of the press-connecting blades.

Therefore, a necessary width of each of the opposed inner surfaces of the press-connecting blades, a necessary size of the gap, and the necessary number of the press-connecting blades may be determined on the basis of the cross-sectional area of the conductor of the electric wire.

In other words, the effective total contact area may be set on the basis of at least one of the width of each of the opposed inner surfaces, the size of the gap, and the number of the opposed inner surfaces, with respect to the conductor.

DETAILED DESCRIPTION OF THE PREFERRED EMBODIMENT

One preferred embodiment of a press-connecting terminal of the present invention will now be described in detail with reference to FIGS. 1 to 5.

Figure 1:
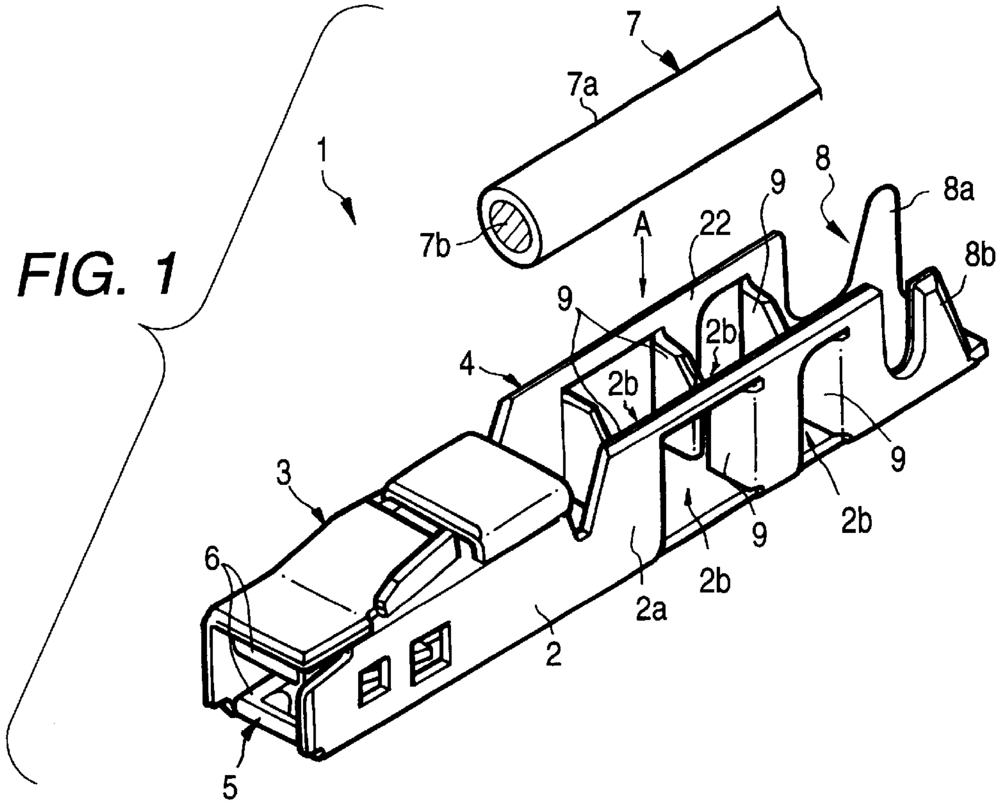
FIG. 1 is a perspective view showing an important portion of a press-connecting terminal of the present invention.
Figure 2:
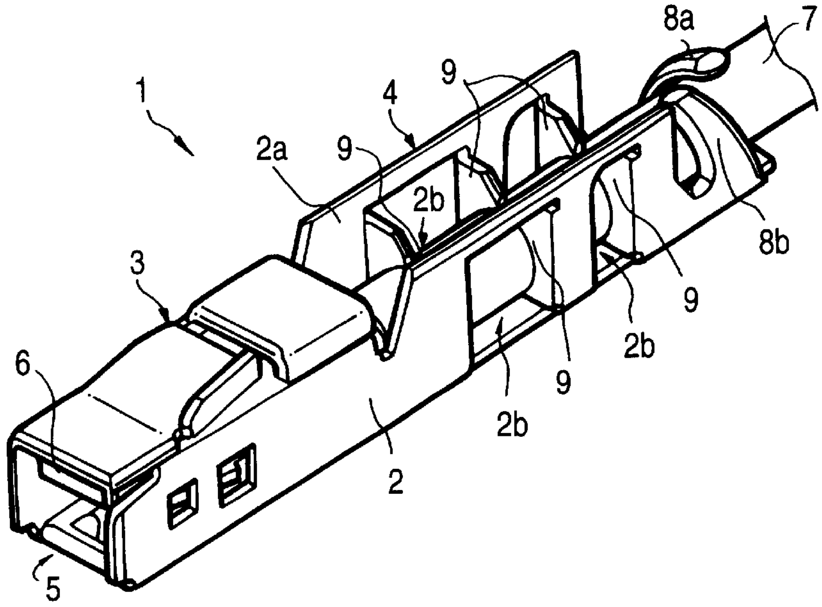
FIG. 2 is a view similar to FIG. 1, but showing an electric wire press-fitted in the press-connecting terminal.
Figure 3:
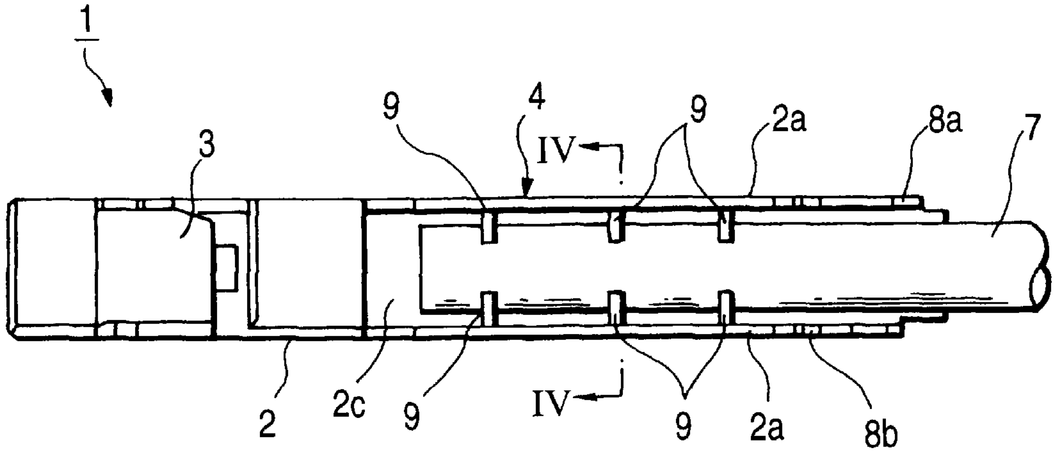
FIG. 3 is a plan view of the press-connecting terminal of FIG. 2.

As shown in FIGS. 1 to 3, the press-connecting terminal 1 of this embodiment is formed by bending an electrically-conductive sheet 2. This press-connecting terminal 1 broadly includes a connection portion 3 and a press-connecting portion 4, both of which are disposed on the base of the press-connecting terminal 1. A male terminal (not shown) in a mating connector can be electrically connected to the connection portion 3, and an insertion port 5 for receiving the mating male terminal is formed in a front end of the connection portion 3. A resilient contact piece portion 6 for resiliently contacting with the male terminal in the mating connector is provided within an internal space of the connection portion 3 communicating with the insertion port 5.

The press-connecting portion 4 includes a barrel portion 8, having a pair of retaining piece portions 8*a* and 8*b* for press-holding the electric wire 7 through a sheath 7*a* thereof in intersecting relation to an axis (centerline) of the electric wire 7, and three press-connecting blades 9 each for cutting the sheath 7*a* of the electric wire 7 to press-contact and hold a conductor 7*b* of the electric wire in a direction, intersecting the axis of the electric wire, to be electrically connected to the conductor 7*b*.

The pair of retaining piece portions 8*a* an 8*b* of the barrel portion 8 are formed by stamping part of opposed side plates 2*a* of the metal sheet 2. The press-connecting blades 9 are formed by cutting part of the side plates 2*a* and then by bending these stamped portions inwardly from stamped openings 2*b*.

Figure 4:
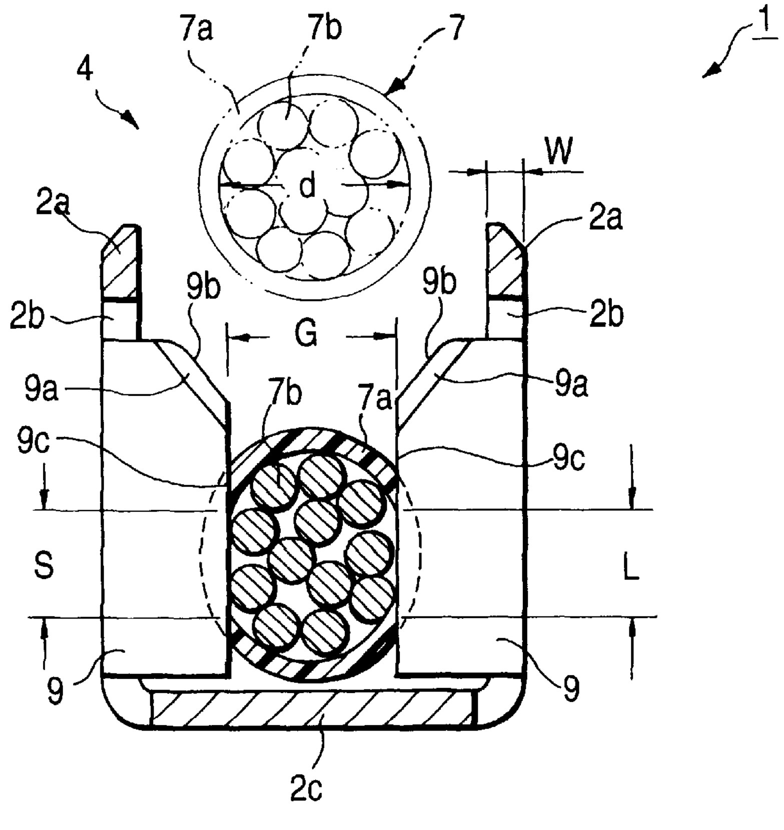
FIG. 4 is a cross-sectional view taken along the line IV—IV of FIG. 3.

As shown in FIG. 4, each of the press-connecting blades 9 has a pair of bladed, tapering guide surfaces 9*a* which are formed at an upper end portion thereof, and are slanting downwardly toward the axis of the electric wire 7. The bladed, tapering guide surface 9*a* has an edge 9*b* formed along its slanting surface by cutting.

The press-connecting blade 9 has a pair of opposed inner surfaces 9*c* and 9*c* which extend downwardly toward a bottom wall 2*c* respectively from the bladed, tapering guide surfaces 9*a,* with a gap G formed therebetween, the gap G being smaller than the diameter d of the conductor 7*b.*

When the electric wire 7 is press-fitted into each press-connecting blade 9 in a direction of arrow A as shown in FIGS. 1 and 4, the edges 9*b* cut the sheath 7*a* of the electric wire 7, while gradually compressing and deforming the outer diameter of the electric wire 7 by the pair of bladed, tapering guide surfaces 9*a.* When the electric wire 7 is further press-fitted, the edges 9*b* completely cut the sheath 7*a.*

The gap G is thus smaller than the diameter d of the conductor 7*b* (i.e., $G<d$), and in this case, the conductor 7*b,* comprising a stranded wire comprised of thin wires twisted together, is deformed into a vertically-spread shape by the downwardly-extending inner surfaces 9*c,* as shown in FIG. 4. The conductor 7*b* is exposed through cut portions of the sheath 7*a,* and directly contacts the downwardly-extending inner surfaces 9*c.*

Figure 5:
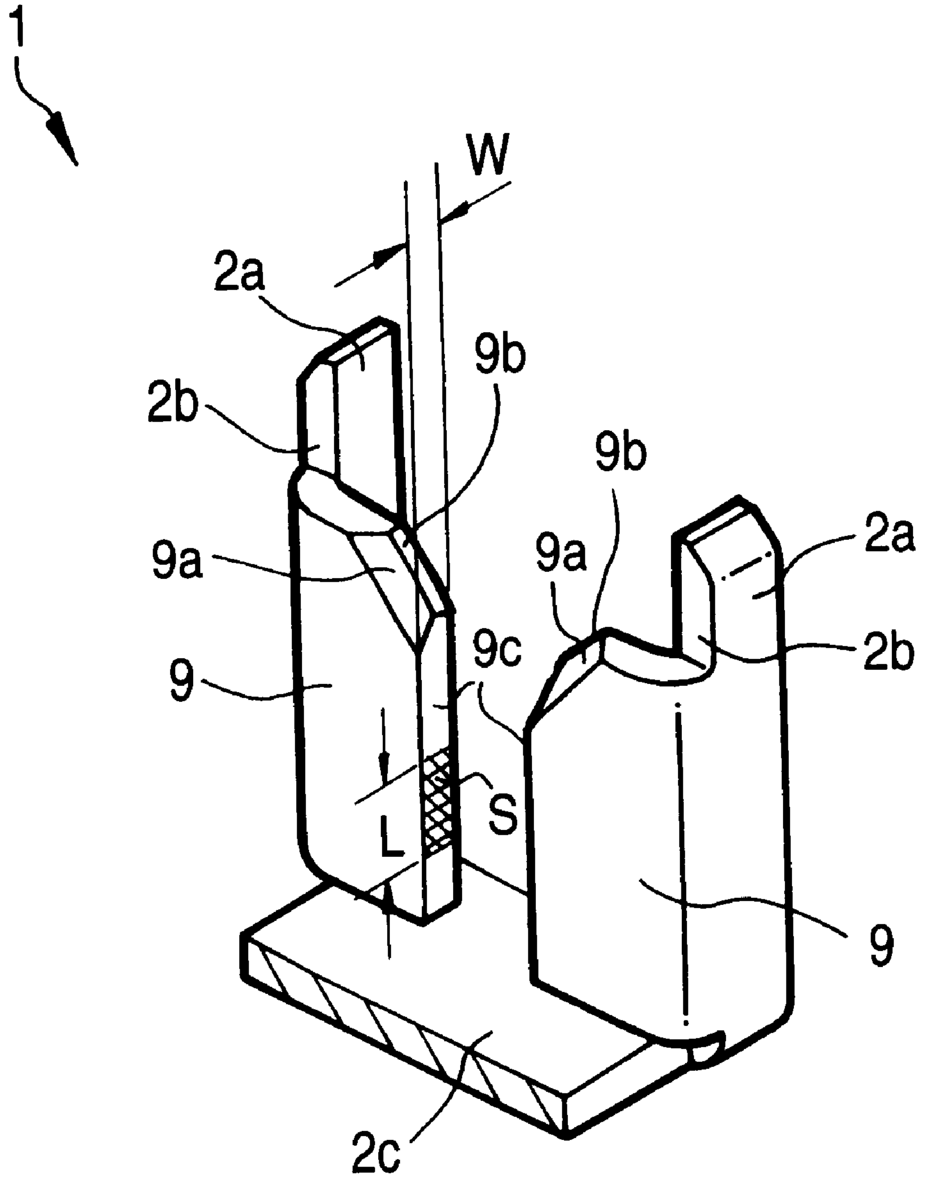
FIG. 5 is a perspective view of a press-connecting blade in FIG. 4.
Figure 6:
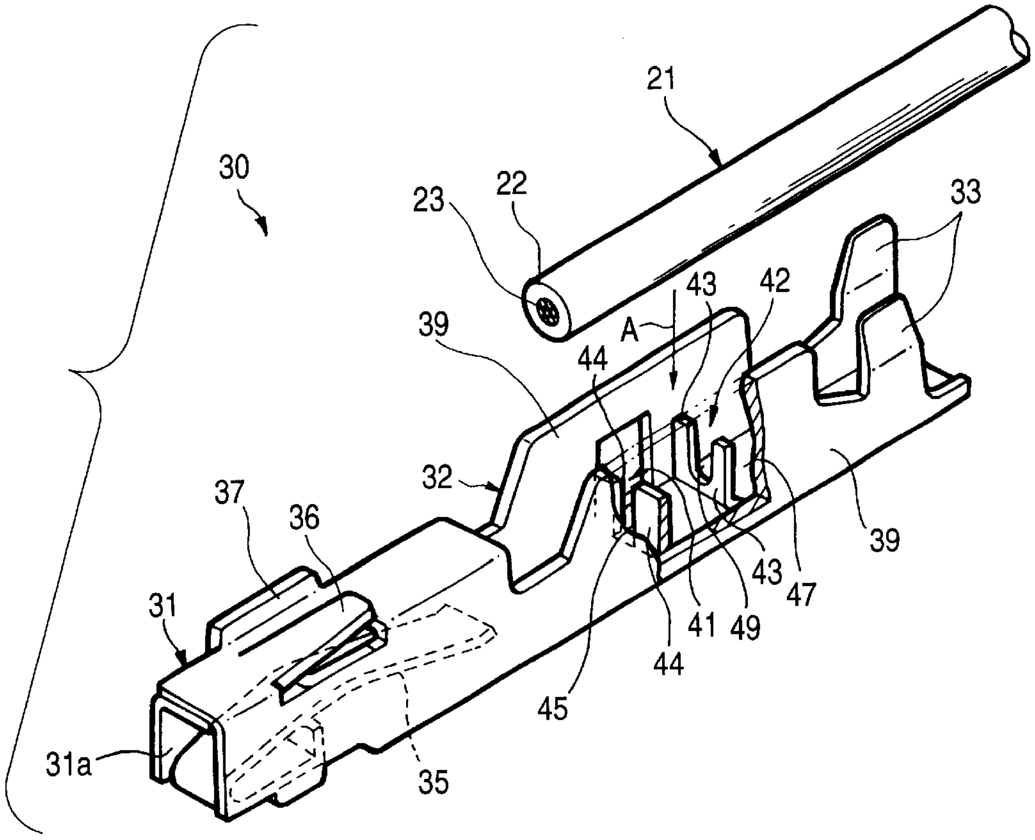
FIG. 6 PRIOR ART
FIG. 6 is a perspective view showing an important portion of a conventional press-connecting terminal.
Figure 7:
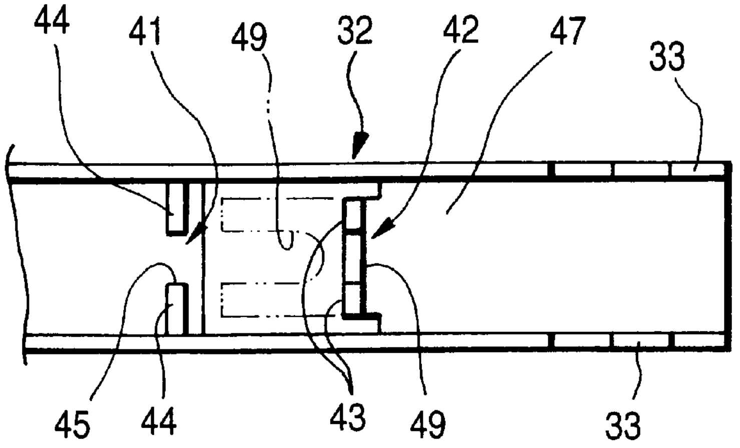
FIG. 7 PRIOR ART
FIG. 7 is a plan view of the terminal of FIG. 6.
Figure 8:
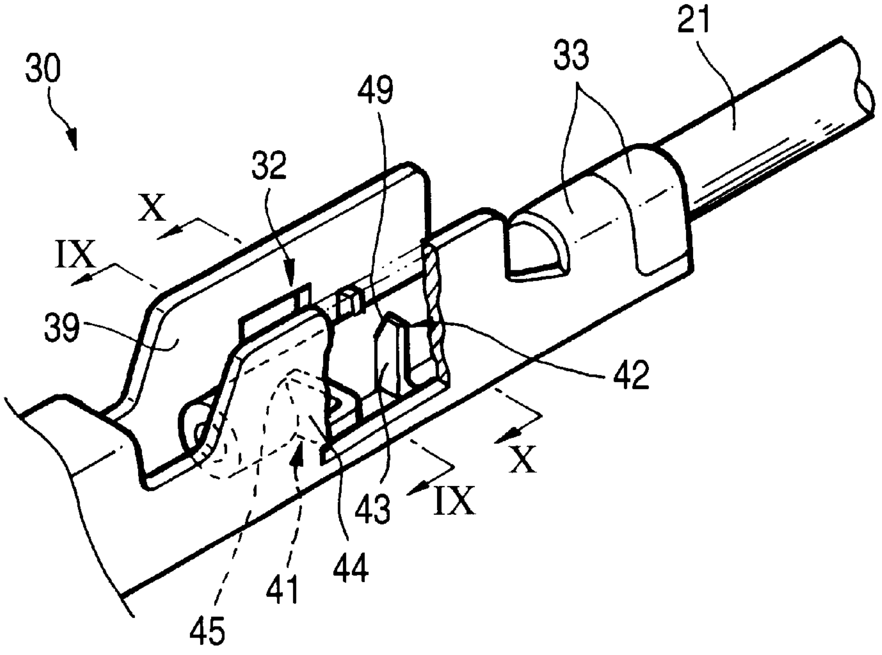
FIG. 8 PRIOR ART
FIG. 8 is a perspective view, showing a condition in which an electric wire is press-fitted in the press-connecting terminal of FIG. 6.
Figure 9:
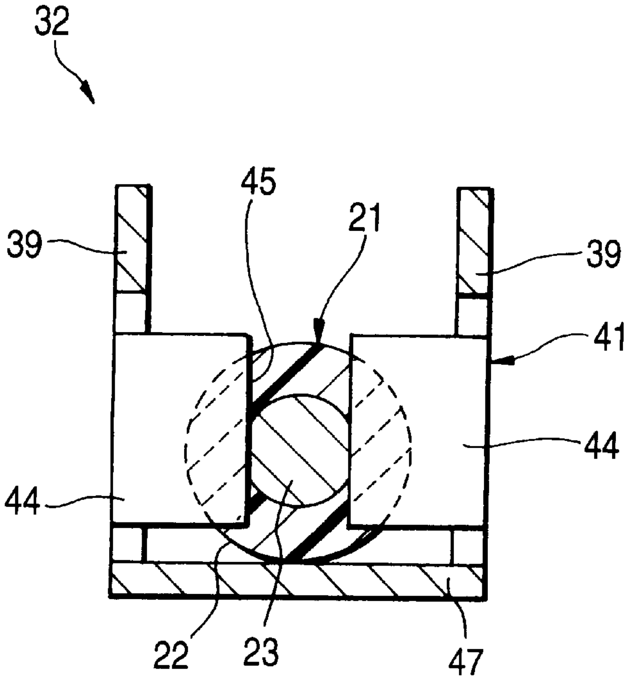
FIG. 9 PRIOR ART
FIG. 9 is a cross-sectional view taken along the line IX—IX of FIG. 8.
Figure 10:
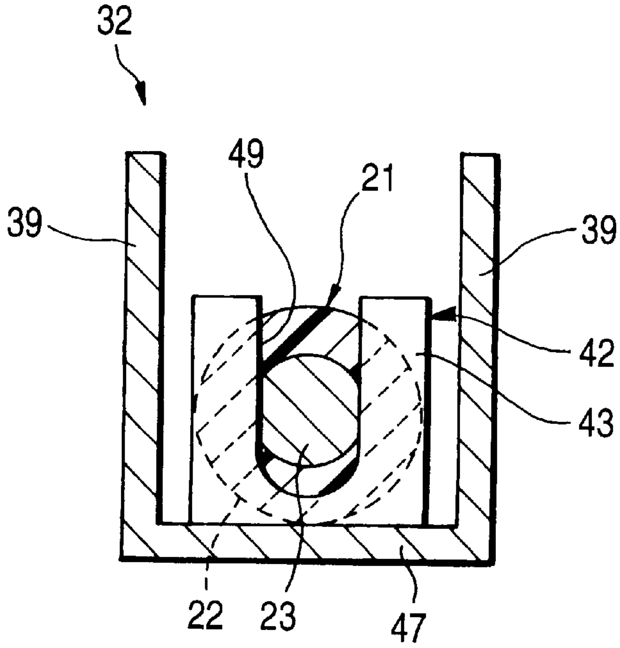
FIG. 10 PRIOR ART
FIG. 10 is a cross-sectional view taken along the line X—X of FIG. 8.

As shown in FIGS. 4 and 5, each press-connecting blade 9 is formed by stamping part of the side plates 2*a* and then by bending these stamped portions inwardly. Therefore, a width W of each downwardly-extending inner surface 9*c* for contact with the conductor 7*b* is equal to the thickness of the side plate 2*a.*

Therefore, the area S of contact of each downwardly-extending inner surface 9*c* with the conductor 7*b* is expressed by $S=W\times L$ (L: a length of contact of the downwardly-extending inner surface with the conductor).

The press-connecting terminal 1 of this embodiment has the three pairs of downwardly-extending inner surfaces 9*c,* and each pair of inner surfaces 9*c* contact the opposite sides of the conductor 7*b,* respectively. Therefore, the total contact area $S_T$ of the downwardly-extending inner surfaces 9*c* is expressed by $S_T=2n\times W\times L$ (n: the number of press-connecting blades).

Therefore, in the press-connecting terminal 1 of this embodiment, on the basis of the width W of each downwardly-extending inner surface 9*c,* the gap G and the number n of the press-connecting blades, the substantial total area $S_T$ of contact of the downwardly-extending inner surfaces 9*c* with the conductor 7*b* is set to a value greater than or equal to the cross-sectional area $\pi d^2/4$ of the conductor 7*b.* With this construction, an electrical resistance, developing between the conductor 7*b* and each press-connecting blade 9, can be greatly reduced, so that the good electrically-connected condition can be maintained.

The angle and length of inclination of the bladed, tapering guide surfaces 9*a,* the length of the edges 9*b* and the gap G between each pair of downwardly-extending inner surfaces 9*c* can be changed in accordance with the outer diameter of the electric wire 7 and the diameter d of the conductor 7*b* so that the functions of the press-connecting blades 9 to deform, cut, press-contact and hold the electric wire 7, as well as the electrical connection of the press-connecting blades to the electric wire, can be suitably adjusted.

As described above, in the press-connecting terminal of the present invention, the press-connecting blade has the pair of opposed inner surfaces extending downwardly respectively from the pair of bladed, tapering guide surfaces which are slanting inwardly downwardly, and the gap, formed between the pair of downwardly-extending inner surfaces, is smaller than the diameter of the conductor of the electric wire. On the basis of at least one of the width of each of the downwardly-extending inner surfaces, the size of the gap, and the number of the downwardly-extending inner surfaces, the effective total area of contact of the downwardly-extending inner surfaces with the conductor is set to a value not smaller than the cross-sectional area of the conductor.

Therefore, the functions of the press-connecting blades to press-contact and hold the conductor, as well as the electrical connection of the press-connecting blades to the conductor, can be suitably achieved. Therefore, those members around the press-connecting portion are prevented from being subjected to deterioration, improper contact and so on by heat produced by the electrical resistance developing between the conductor and each press-connecting blade, and therefore the safety of the vehicle is positively prevented from being affected.

What is claimed is:

1. A press-connecting terminal, comprising:

a base;

a connection portion, to which a connection terminal of a mating connector is electrically connectable, disposed on the base; and a press-connecting portion, to which a conductor of an electric wire is electrically connectable, disposed on the base, the press-connecting portion including plural pairs of press-connecting blades, each pair of which have:

a pair of bladed, tapering guide surfaces which slant inwardly downwardly, and a pair of opposed inner surfaces, between which a gap smaller than a diameter of the conductor of the electric wire is formed, and which downwardly extend respectively from the pair of tapering guide surfaces;

wherein when an electric wire is press-fitted into the gap, the conductor of the electric wire is electrically connected to and held by the plural pairs of press-connecting blades, and wherein an effective total contact area of the opposed inner surfaces of the press-connecting blades with the conductor is set to a value equal to or greater than a cross-sectional area of the conductor.

2. The press-connecting terminal of claim 1, wherein the effective total contact area is such a total of areas that the conductor of the electric wire contacts with the opposed inner surfaces of the press-connecting blades.

3. The press-connecting terminal of claim 1, wherein the effective total contact area is set to a predetermined value based on at least one of a width of each of the opposed inner surfaces, a size of the gap, and the number of the opposed inner surfaces, with respect to the conductor of the electric wire.

4. The press-connecting terminal of claim 1, wherein a width of each of the opposed inner surfaces of the press-connecting blades, a size of the gap, and a number of the press-connecting blades comprising the plural pairs of press-contacting blades are determined based on the cross-sectional area of the conductor of the electric wire.

5. The press-connecting terminal of claim 4, wherein the effective total contact area is such a total of areas that the conductor of the electric wire contacts with the opposed inner surfaces of the press-connecting blades.

* * * * *